United States Patent
Cripe

(10) Patent No.: US 12,431,928 B2
(45) Date of Patent: Sep. 30, 2025

(54) MIXER-FIRST RADIO RECEIVER CIRCUITRY

(71) Applicant: Rockwell Collins, Inc., Cedar Rapids, IA (US)

(72) Inventor: David W. Cripe, Mount Vernon, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 173 days.

(21) Appl. No.: 18/211,058

(22) Filed: Jun. 16, 2023

(65) Prior Publication Data
US 2024/0421840 A1    Dec. 19, 2024

(51) Int. Cl.
    *H04B 1/16*    (2006.01)
(52) U.S. Cl.
    CPC .................................. *H04B 1/1638* (2013.01)
(58) Field of Classification Search
    CPC ....... H03H 2011/0494; H03H 11/1291; H03H 21/0001; H03H 21/0012; H03H 11/126; H03H 11/22; H03H 11/344; H03H 2210/025; H04B 17/14; H04B 17/19; H04B 17/104; H04B 1/30; H04B 1/28; H04B 1/40; H04B 1/006; H04B 1/707; H04B 1/713; H04B 17/101; H04B 17/20; H04B 1/04; H04B 1/0475; H04B 1/1018; H04B 1/1638; H04B 2001/0491; H04B 7/0413; H04B 7/0452; H04B 7/084; H04B 1/123
    See application file for complete search history.

(56) References Cited

U.S. PATENT DOCUMENTS

| | | |
|---|---|---|
| 4,408,351 A | 10/1983 | Maurer et al. |
| 4,715,047 A | 12/1987 | Hambley |
| 5,179,730 A * | 1/1993 | Loper ................ H03D 3/00 455/306 |
| 5,828,955 A | 10/1998 | Lipowski et al. |
| 5,854,974 A | 12/1998 | Li |
| 6,081,697 A | 6/2000 | Haartsen |
| 6,230,000 B1 | 5/2001 | Tayloe |
| 6,704,558 B1 | 3/2004 | Sorrells et al. |
| 7,092,645 B1 | 8/2006 | Sternowski |
| 7,130,604 B1 | 10/2006 | Wong et al. |
| 10,979,091 B1 | 4/2021 | Wyse |

(Continued)

FOREIGN PATENT DOCUMENTS

JP    2007043290 A    2/2007

OTHER PUBLICATIONS

European Search Report received in EP Application No. 24181030.8, Nov. 27, 2024, 11 pages.

*Primary Examiner* — Golam Sorowar
(74) *Attorney, Agent, or Firm* — Suiter Swantz IP

(57) ABSTRACT

The mixer-first topology of receivers do not include low-noise amplifiers (LNA) preceding the mixer. The Mixer-First topology of radio receivers utilizes a direct-conversion quadrature mixer to down convert an RF signal to baseband, where a Hilbert Transform filter is used for sideband selection. When a switching mixer is used, the mixer-first receiver is capable of extremely high dynamic range and linearity. The downfall of the mixer-first topology is poor out-of-band signal rejection. A mixer-first receiver is described which achieves third-harmonic rejection without bandpass filtering proceeding the mixer.

18 Claims, 5 Drawing Sheets

(56) References Cited

U.S. PATENT DOCUMENTS

| | | | |
|---|---|---|---|
| 2006/0111051 A1* | 5/2006 | Barink | G06K 7/0008 340/572.1 |
| 2006/0217095 A1* | 9/2006 | Kamata | H03L 7/099 455/165.1 |
| 2007/0026835 A1* | 2/2007 | Yamaji | H04B 1/30 455/318 |
| 2009/0104885 A1 | 4/2009 | Asayama et al. | |
| 2011/0043286 A1 | 2/2011 | Youngblood | |
| 2015/0349755 A1* | 12/2015 | van Sinderen | H03K 3/0315 331/45 |
| 2018/0287847 A1* | 10/2018 | Callaghan | H04L 27/345 |

* cited by examiner

MIXER-FIRST RADIO RECEIVER CIRCUITRY

TECHNICAL FIELD

The present invention generally relates to radio receivers, and more specifically to mixer-first topology of radio receivers.

BACKGROUND

In the field of radio receiver design, the superheterodyne topology has been the predominant type. In this scheme, radio frequency (RF) signal are mixed to an intermediate frequency, sharply filtered, then mixed down to baseband. Rejection of image frequencies at the first mixer requires a degree of preselection and bandpass filtering at the antenna.

As solid-state equipment has become common, direct conversion receiver architectures have come into use. These receivers utilize a variable frequency oscillator (VFO) signal to drive a mixer. The mixer splits a phase of the input RF signal into in-phase and quadrature. The input RF signal enters an in-phase and quadrature (IQ) mixer. The IQ mixer creates two baseband signals, in-phase and quadrature. Circuitry to perform a Hilbert Transform all-pass phase shift performs the necessary suppression of the unwanted sideband. The Hilbert transform operation is performed using analog circuitry or in digital signal processing (DSP). Such, IQ mixer include Gilbert cell mixers, diode ring mixers, and the like.

A particular implementation of quadrature direct conversion is described in U.S. Pat. No. 6,230,000, titled "Product detector and method therefor", hereafter Tayloe, which is incorporated herein by reference in the entirety.

Tayloe describes use of a SP4T analog switch switching between adjacent phases at 4× the carrier frequency to create the quadrature down conversion process. Tayloe includes a switching mixer where an analog multiplexer circuit is borrowed from Transistor-transistor logic (TTL) families. One-pole, four-throw multiplex switch to commutate at a rate four times the carrier through switching the antenna signal through 0-degree, 90-degree, 180-degree, and 270-degree output port on the switch. Signals are amplified by low-noise amplifiers to generate baseband in-phase and quadrature signals. The baseband in-phase and quadrature signals are then applied to the Hilbert transform block. The Hilbert transform block gives a single sideband output.

Common logic integrated circuit (IC) multiplexers such as the FST3252 perform the Tayloe switching process with less than 1 dB conversion loss, yielding a receiver with extremely high dynamic range, with a typical IP3 of +26 dBm. An effective implementation of Tayloe in a receiver is to employ a personal computer (PC) stereo sound card to digitize the I and Q baseband signal, and perform the Hilbert Transform in digital signal processing (DSP) within the PC. The single sideband output can then be manipulated and filtered using a software-defined radio (SDR).

A significant shortcoming of the Tayloe mixer scheme comes from the use of the switch as a mixer. Switching a signal through a multiplexing switch has the effect of multiplying the input RF signal by a square wave, comprised of the mixer frequency, and all odd harmonics thereof. Signals occurring at the third harmonic of the oscillator frequency will be most likely to create these spurious image signals at baseband, due to the high third harmonic content in the switch signal, as well as the proximity to the desired carrier frequency. For example, the switches are driven by the local oscillator. The local oscillator frequency may be decomposed into constituent Fourier sums. The constituent Fourier sums include a significant component of the third harmonic of the local oscillator frequency. The significant component of the third harmonic provides the interference. Consequently, these harmonics will mix with any harmonic signals present at the antenna to create spurious signals appearing in the baseband IQ signal. The third harmonic mixes with the third harmonic component of the antenna and is down-converted into the baseband. The third harmonic then shows up as a spurious signal in the baseband.

The Tayloe receiver is susceptible to interference by signals that are three-times the local oscillator frequency. The interference is due to the signals that are applied to the switches. One method to remove the third harmonic component of the drive signal is to provide a filter before the mixer (e.g., bandpass filter, lowpass filter, roofing filter, or the like). Sharp bandpass filtering must proceed the mixer to prevent the third harmonic signals from entering and spurious signals from being generated in the baseband. Adding the filter removes the purpose of the mixer-first architecture. Namely, adding the filter reduces the band of frequencies which the Tayloe receiver can receive. Therefore, it would be advantageous to provide a device, system, and method that cures the shortcomings described above.

SUMMARY

A receiver comprises a local oscillator (LO) configured to generate an LO signal comprising an LO frequency. The receiver comprises a single-pole, triple-throw (SP3T) switch. The SP3T comprises a radio frequency (RF) port configured to receive an RF signal comprising a baseband signal modulated onto a carrier signal. The SP3T comprises an LO port configured to receive the LO signal. The SP3T comprises a 0-degree port, a 120-degree port, and a 240-degree port. The SP3T switch is configured to sequentially switch the RF port to each of the 0-degree port, the 120-degree port, and the 240-degree port at the LO frequency. The LO frequency is three times the carrier frequency such that the RF port is sequentially switched to each of the 0-degree port, the 120-degree port, and the 240-degree port once during each period of the LO frequency. The receiver comprises a first capacitor coupled between the 0-degree port and ground. The receiver comprises a second capacitor coupled between the 120-degree port and ground. The receiver comprises a third capacitor coupled between the 240-degree port and ground. The receiver comprises an image-reject filter coupled to the 0-degree port, the 120-degree port, and the 240-degree port. The image-reject filter is configured to output the baseband signal.

The receiver is a mixer-first design which does not comprise an amplifier preceding the SP3T switch.

The receiver intrinsically rejects third-harmonics of the LO frequency in the RF signal; wherein the receiver does not comprise a filter preceding the SP3T switch.

The first capacitor is configured to low-pass filter the 0-degree port. The second capacitor is configured to low-pass filter the 120-degree port. The third capacitor is configured to low-pass filter the 240-degree port.

The local oscillator is a variable frequency oscillator.

The receiver is a transceiver configured to upconvert the baseband signal to the RF signal.

The RF signal comprises the baseband signal modulated onto the carrier signal via single-sideband modulation.

The image-reject filter comprises a first differential amplifier coupled to the 0-degree port, the 120-degree port, and the 240-degree port. The first differential amplifier is configured to output an in-phase signal based on three-phase signals received from the 0-degree port, the 120-degree port, and the 240-degree port. The image-reject filter comprises a second differential amplifier coupled to the 120-degree port and the 240-degree port. The second differential amplifier is configured to output a quadrature signal based on three-phase signals from the 120-degree port and the 240-degree port.

The image-reject filter comprises a 3-phase to 2-phase transformer coupled to the 0-degree port, the 120-degree port, and the 240-degree port. The 3-phase to 2-phase transformer is configured to output an in-phase signal and a quadrature signal based on three-phase signals received from the 0-degree port, the 120-degree port, and the 240-degree port.

The image-reject filter is configured to generate an in-phase signal and a quadrature signal based on three-phase signals received from the 0-degree port, the 120-degree port, and the 240-degree port. The image-reject filter comprises a 2-phase Hilbert transformer configured to receive the in-phase signal and the quadrature signal and further configured to output a phase-shifted quadrature signal based on the quadrature signal. The image-reject filter comprises a 2-input summing circuit configured to generate the baseband signal based on the in-phase signal and the phase-shifted quadrature signal.

The receiver comprises a digital signal processor comprising the 2-phase Hilbert transformer and the 2-input summing circuit.

The image-reject filter comprises a 3-input phase shifter configured to phase shift three-phase signals received from the 0-degree port, the 120-degree port, and the 240-degree port to generate phase-shifted signals with a common phase. The image-reject filter comprises a 3-input summing circuit configured to sum the phase-shifted signals from the 3-input phase shifter to generate the baseband signal.

The 3-input phase shifter is configured to perform a 120-degree phase shift on signals received from the 120-degree port and perform a 240-degree phase shift on signals received from the 240-degree port.

The receiver comprises a digital signal processor comprising the 3-input phase shifter and the 3-input summing circuit.

A system comprises an antenna configured to generate a radio frequency (RF) signal. The system comprises a receiver coupled to the antenna. The receiver comprises a local oscillator (LO) configured to generate an LO signal comprising an LO frequency. The receiver comprises a single-pole, triple-throw (SP3T) switch. The SP3T switch comprises a radio frequency (RF) port configured to receive the RF signal comprising a baseband signal modulated onto a carrier signal. The SP3T switch comprises an LO port configured to receive the LO signal. The SP3T switch comprises a 0-degree port, a 120-degree port, and a 240-degree port. The SP3T switch is configured to sequentially switch the RF port to each of the 0-degree port, the 120-degree port, and the 240-degree port at the LO frequency. The LO frequency is three times the carrier frequency such that the RF port is sequentially switched to each of the 0-degree port, the 120-degree port, and the 240-degree port once during each period of the LO frequency. The receiver comprises a first capacitor coupled between the 0-degree port and ground. The receiver comprises a second capacitor coupled between the 120-degree port and ground. The receiver comprises a third capacitor coupled between the 240-degree port and ground. The receiver comprises an image-reject filter coupled to the 0-degree port, the 120-degree port, and the 240-degree port; wherein the image-reject filter is configured to output the baseband signal.

BRIEF DESCRIPTION OF THE DRAWINGS

Implementations of the concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION OF THE INVENTION

Figure 1:
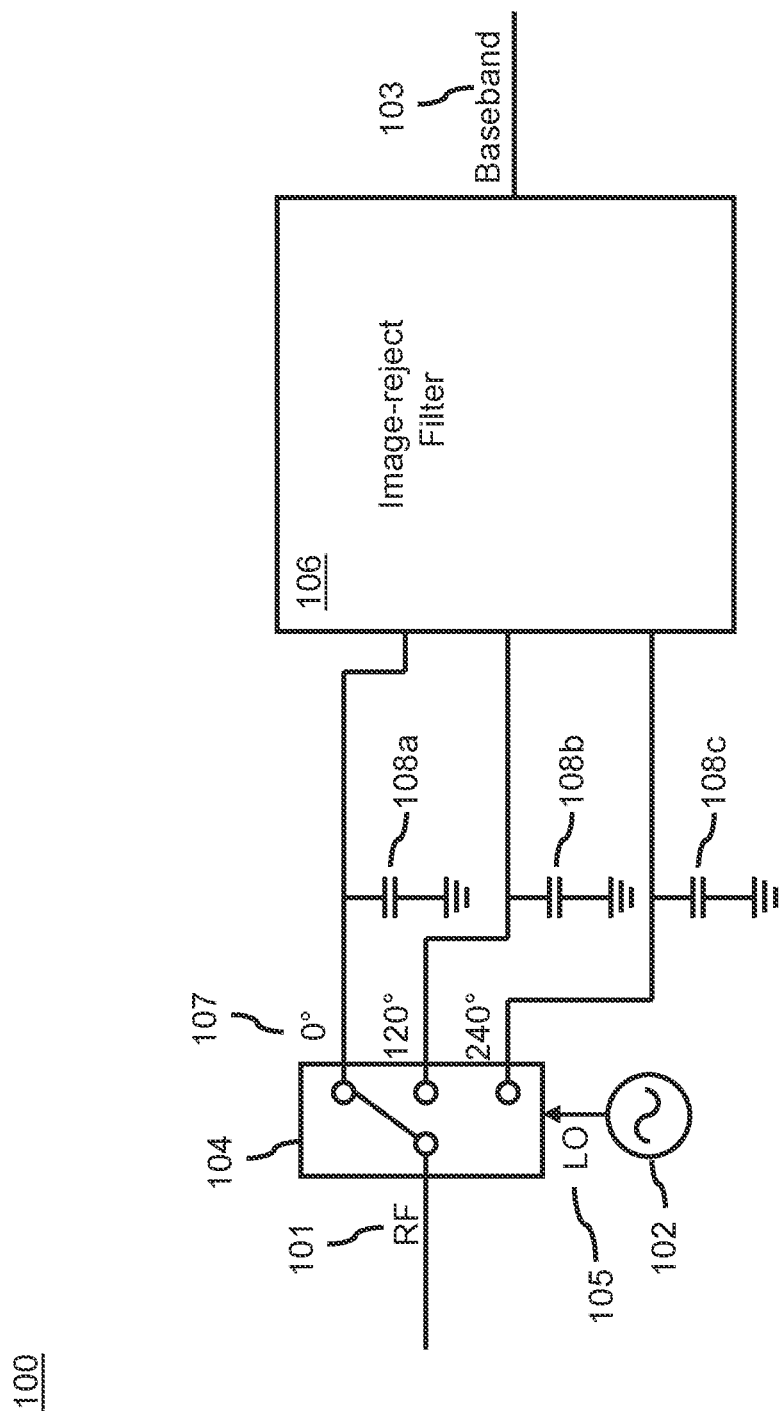
FIG. 1 depicts a schematic diagram of a receiver, in accordance with one or more embodiments of the present disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details are set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1*a*, 1*b*). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a"

and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

Reference will now be made in detail to the subject matter disclosed, which is illustrated in the accompanying drawings. Embodiments of the present disclosure are generally directed to a mixer-first receiver that uses pulsed waveforms containing zero third harmonic content. Specifically, a pulse that is high for 120 degrees, and low for 240 degrees (or vice versa) contains zero third harmonic content. The pulsed waveforms are used as drive signals in a switching mixer. The receiver exhibits inherent suppression of third harmonic signal interference when the mixer is driven by the drive signals. From this insight, the receiver has immunity to third harmonic interference.

A variable frequency oscillator (VFO) clock operating at 3× the carrier frequency drives a single-pole, three-throw (SP3T) analog switch through each of its outputs sequentially through 120-degree intervals. The outputs are low-pass filtered to produce signals at 0, 120 and 240 degrees.

In some embodiments, the signals at 0, 120 and 240 degrees are converted to quadrature by combining these three vectors in a weighted sum to create a 0-degree and 90-degree baseband output. Op-amp circuits or 3-phase to 2-phase transformer circuits are used to convert to quadrature. The 0-degree and 90-degree baseband output are fed to a Hilbert Transform filter to reject the unwanted sideband signal. The output of the Hilbert Transform filter is summed to generate a baseband signal. In some embodiments, the signals at 0, 120 and 240 degrees are phase shifted to a common phase and then summed to generate the baseband signal.

Referring now to FIG. 1, a receiver 100 is described, in accordance with one or more embodiments of the present disclosure. The receiver 100 includes one or more components, such as, but not limited to, a local oscillator 102, a SP3T switch 104, an image-reject filter 106, one or more capacitors 108, and the like.

The receiver 100 is configured to receive a radio frequency (RF) signal 101. The RF signal 101 includes a baseband signal 103 modulated onto a carrier signal. The carrier signal includes a carrier frequency. The baseband signal 103 includes a baseband frequency at a much lower frequency than the carrier frequency. In some embodiments, the baseband signal 103 is modulated onto the carrier frequency via single-sideband (SSB) modulation. For example, the RF signal 101 is equal to the carrier (C) signal plus or minus the baseband (M) signal 103.

The receiver is configured to down convert the RF signal 101 to the baseband signal 103. The receiver 100 generates the baseband signal 103 with a SSB from the RF signal 101. The receiver 100 removes the carrier signal and an image (e.g., opposite sideband) from the RF signal 101 to generate the baseband signal 101. In some embodiments, the receiver 100 may be referred to as a down convert, image-reject receiver. The down convert, image-reject receiver performs both down conversion and image rejection. The down convert, image-reject receiver performs the down conversion using the SP3T switch 104 and the capacitors 108 and performs the image rejection using the image-reject filter 106, as will be described further herein.

The receiver 100 includes the local oscillator 102. The local oscillator 102 may also be referred to as a system clock. The local oscillator 102 is configured to generate a local oscillator (LO) signal 105. The LO signal 105 includes a LO frequency ($f_{LO}$). The LO frequency ($f_{LO}$) is three times the carrier frequency ($f_C$).

In some embodiments, the local oscillator 102 is a variable frequency oscillator (VFO). The VFO is configured to vary the LO frequency ($f_{LO}$) according to the carrier frequency ($f_C$). For example, the carrier frequency ($f_C$) may be frequency hopped. The VFO is configured to vary the LO frequency ($f_{LO}$) with the carrier frequency ($f_C$) as the carrier frequency ($f_C$) is frequency hopped. Although the local oscillator 102 is described as a VFO, this is not intended as a limitation of the present disclosure. It is further contemplated that the local oscillator 102 may be a fixed local oscillator. The fixed local oscillator may be in a multiple conversion superheterodyne architecture, or the like.

The receiver 100 also includes the single-pole, triple-throw (SP3T) switch 104. In some embodiments, the SP3T switch 104 may be considered a down-convert mixer and/or a zero-delay, analog multiplexer. The SP3T switch 104 may also be referred to as a quadrature mixer with $3^{rd}$ harmonic suppression.

The SP3T switch 104 includes a radio frequency (RF) port, an LO port, a 0-degree port, a 120-degree port, and a 240-degree port. The RF port is configured to receive and/or transmit the RF signal 101. The LO port is coupled to the local oscillator 102 and is configured to receive the LO signal 105. The LO signal 105 drives the SP3T switch 104 to sequentially switch between the 0-degree port, 120-degree port, and the 240-degree port. The SP3T switch is configured to sequentially switch the RF port to each of the 0-degree port, the 120-degree port, and the 240-degree port at the LO frequency ($f_{LO}$). As described previously herein, the LO frequency ($f_{LO}$) is three times the carrier frequency ($f_C$) such that the RF port is sequentially switched to each of the 0-degree port, the 120-degree port, and the 240-degree port once during each period of the LO frequency ($f_{LO}$). In this regard, the SP3T switch 104 switches between the three ports for a third of each period of the RF signal 101. The SP3T switch 104 then outputs three-phase signals 107 to the 0-degree port, 120-degree port, and 240-degree port. The SP3T switch 104 down-converts the RF signal 101 and outputs the three-phase signals 107 at a baseband frequency. The SP3T switch 104 outputs the three-phase signals 107. The three-phase signals 107 include a signal at a 0-degree phase, a signal at a 120-degree phase, and a signal at a 240-degree phase.

The three-phase signals 107 output by the SP3T switch 104 intrinsically achieves rejection of frequencies at the third-harmonic carrier frequency. The SP3T switch 104 doesn't introduce the third harmonic due to the shape of the LO signal 105 that drives the SP3T switch 104. Fourier decomposition of the LO signal 105 does not contain a third harmonic term. The lack of the third harmonic term in the Fourier decomposition causes the SP3T switch 104 to intrinsically achieve the rejection of the third harmonic. The intrinsic rejection of frequencies at three times the carrier frequency causes the receiver 100 to be less susceptible to other signals with frequencies near the third harmonic of the desired receiver frequency, without the need for a filter before the SP3T switch 104.

Notably, Fourier decomposition of the LO signal 105 contains a second harmonic term. The second harmonic appears in the three-phase signals 107 output by the SP3T switch 104. However, the second harmonic is rejected by the image-reject filter 106. The second harmonic term is rejected because of the symmetry of the output for the three-phase signals 107. Summing the outputs in the image-reject filter 106 subtracts out the second harmonic.

In some embodiments, the receiver 100 may be configured to receive the RF signal 101 including the carrier signal with the carrier frequency in the High Frequency (HF) band and/or the Very High Frequency (VHF) band. The HF band is between 3 and 30 MHz. The VHF band is between 30 and 300 MHz. In some embodiments, the SP3T switch 104 is a Transistor-transistor logic (TTL) chip. The TTL chips may have a frequency limitation of around 90 MHz. The receiver 100 may then be configured to receive the RF signal 101 including the carrier signal with the carrier frequency in the HF band and output the baseband signal 103. Although the SP3T switch 104 is described as a TTL chip, this is not intended as a limitation of the present disclosure. In some embodiments, the SP3T switch 104 may include a discrete semiconductor switch. For example, the discrete semiconductor switch may include gallium nitride (GaN) switches, gallium arsenide (GaA) switches, or the like. The receiver 100 may then be configured to receive the RF signal 101 including the carrier signal with the carrier frequency in the HF band and/or the VHF band and output the baseband signal 103.

The three-phase signals 107 each include a lower sideband component and an upper sideband component. The lower sideband component may be referred to as a baseband frequency and/or a difference frequency. The upper sideband component may be referred to as a higher frequency image of the baseband frequency and/or a sum frequency.

In embodiments, the receiver 100 includes the capacitors 108. The capacitors 108 are coupled between the output ports of the SP3T switch and ground and are in parallel with the image-reject filter 106. The receiver 100 include a first capacitor 108a coupled between the 0-degree port and ground, a second capacitor 108b coupled between the 120-degree port and ground, and a third capacitor 108c coupled between the 240-degree port and ground.

The capacitors 108 perform low-pass filtering of the three-phase signals 107 from the SP3T switch 104. The capacitors 108 perform the low-pass filtering of the three-phase signals 107 by acting as a Resistor-Capacitor (RC) low-pass filter. The low-pass filtering removes the high frequency components that result from the down conversion process. For example, the capacitors 108 filter the upper sideband component from each of the three-phase signals 107 to ground. The capacitors 108 pass the lower sideband component of each of the three-phase signals 107 to the image-reject filter 106. The first capacitor 108a is configured to low-pass filter the 0-degree port, the second capacitor 108b is configured to low-pass filter the 120-degree port, and the third capacitor 108c is configured to low-pass filter the 240-degree port.

In embodiments, the receiver 100 includes the image-reject filter 106. The image-reject filter 106 is coupled to the 0-degree port, the 120-degree port, and the 240-degree port of the SP3T switch 104. The image-reject filter 106 receives the three-phase signals 107 from the image-reject filter 106 by the coupling to the respective ports of the SP3T switch 104. The image-reject filter 106 is configured to output the baseband signal 103 based on the three-phase signals 107.

Several designs are contemplated for the image-reject filter 106. For example, the image-reject filter 106 may include, but is not limited to, an image-reject filter 106a (see FIG. 2), an image-reject filter 106b (see FIG. 3), and/or an image-reject filter 106c (see FIG. 4).

Although much of the present disclosure is described in the context of receiving the RF signal 101 and down converting to the baseband signal 103, this is not intended as a limitation of the present disclosure. The receiver 100 is also a transceiver configured to up convert the baseband signal 103 to the RF signal 101. The components of the receiver 100, such as, but not limited to, local oscillator 102, SP3T switch 104, image-reject filter 106, one or more capacitors 108, and the like may function with a reverse signal flow (i.e., from baseband 103 to RF signal 101). The receiver 100 is then configured to both convert the RF signal 101 to the baseband 103 and convert the baseband signal 103 to the RF signal 101. The down conversion technique may be employed in reverse, to upconvert baseband signal 103 to single-sideband (SSB) RF. Quadrature baseband is converted to three-phase baseband using an op amp circuit or hybrid transformer, and fed to the SP3T switch 104, where the three-phase switching will convert the baseband to the RF signal 101. The reduced third-harmonic content of the switch-produced RF will require less low-pass filtering to yield the RF signal 101. As the high frequency content of the switch-produced RF signal 101 can be a source of intermodulation in subsequent RF amplification stages, this technique will yield a lower-distortion signal. When applied in the up conversion of the baseband signal 103 to the RF signal 101, the RF signal 101 has lower harmonic content and yields lower intermodulation in subsequent RF amplification stages.

The RF signal 101 output from the SP3T switch 104 includes less of the high frequency components, specifically third harmonic, after up conversion. The transceiver intrinsically has reduced intermodulation distortion in the transmitted signal. The transceiver intrinsically has reduced intermodulation distortion in the transmitted signal because there is less opportunity for the high frequency switching edges to create asymmetrical slew rates within the amplifier circuitry and induced intermodulation.

In embodiments, the receiver 100 is a mixer-first design which does not comprise an amplifier preceding the SP3T switch 104. In this regard, the RF signal 101 is not amplified by the receiver 100 before the SP3T switch 104 receives the RF signal 101. In embodiments, the receiver 100 intrinsically rejects third-harmonics of the LO frequency in the RF signal 101. The receiver 100 does not comprise a filter (e.g., bandpass filter) preceding the SP3T switch 104. In this regard, the RF signal 101 is unfiltered before being received by the SP3T switch 104. Advantageously, the receiver 100 does not need to include the filter by intrinsically rejecting the harmonics, and is therefore enabled to operate the VFO frequency over a wider range without interference. The term Mixer-first implies that there is no low-noise amplifier and no-filter prior to the down-convert process (e.g., no roofing filter, no bandwidth limitation, and the like). By being the mixer-first receivers, the receiver 100 is highly linear with a wide dynamic range or a very wide band of frequencies. The mixer-first receivers accommodates most signals that are received.

Figure 2:
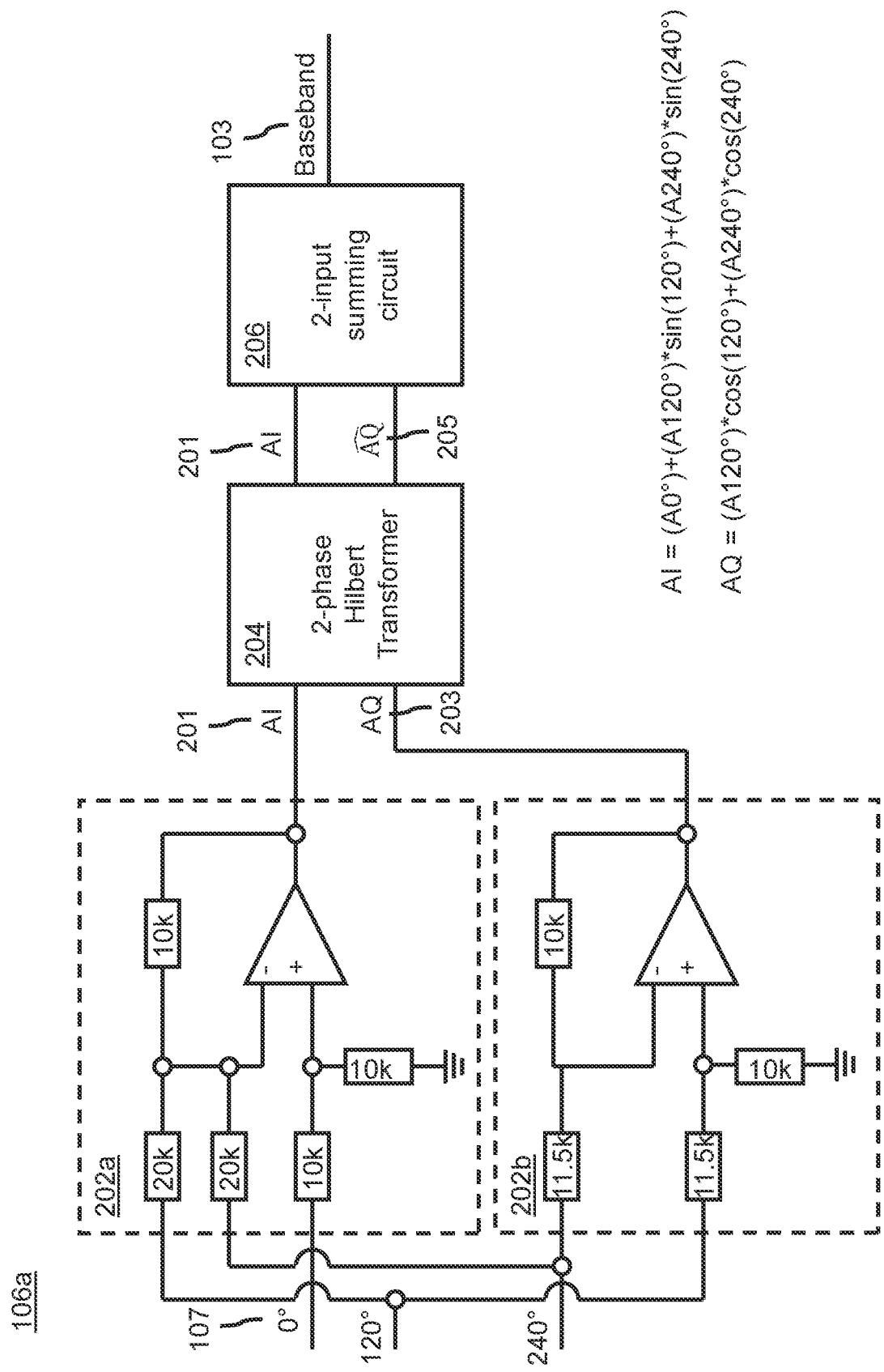
FIG. 2 depicts a schematic diagram of an image-reject filter including a pair of differential amplifiers, in accordance with one or more embodiments of the present disclosure.

Referring now to FIG. 2, image-reject filter 106a is described, in accordance with one or more embodiments of the present disclosure. The image-reject filter 106a is one example of the image-reject filter 106 of the receiver 100. The image-reject filter 106a is configured to receive the three-phase signals 107 (e.g., 0-degree phase, 120-degree phase, and 240-degree phase) and output the baseband signal 103. The image-reject filter 106a includes one or more components, such as, but not limited to, differential amplifiers 202, a Hilbert transformer 204, a 2-input summing circuit 206, or the like.

In embodiments, the image-reject filter 106a includes the differential amplifiers 202. The differential amplifiers 202 may include one or more passive components, such as, but not limited to, resistors and operational amplifiers. The values provided for the resistors are exemplary and are not intended to be limiting.

In embodiments, the image-reject filter 106a includes a first differential amplifier 202a. A first differential amplifier 202a is coupled to the 0-degree port, the 120-degree port, and the 240-degree port. The first differential amplifier 202 is configured to output an in-phase signal (AI) 201 based on the three-phase signals 107 received from the 0-degree port, the 120-degree port, and the 240-degree port.

The in-phase signal 201 is represented by the sine function of each of these three-phase signals 107. The first differential amplifier 202a takes the sum of each of the sine of the three-phase signals 107 multiplied by the voltage present at each of the three-phase signals 107 to get the in-phase signal 201. For example, the in-phase signal 201 is equal to the magnitude of the signal at the 0-degree phase (A0°) plus the magnitude of the signal at the 120-degree phase (A120°) times the sin (120°) plus the magnitude of the signal at the 240-degree phase (A240°) times the sin (240°), or in other words $$AI = (A0°) + (A120°)*\sin(120°) + (A240°)*\sin(240°).$$

A schematic of the first differential amplifier 202a is now described. The first differential amplifier 202a may include an input (Vin−) coupled in parallel to the 120-degree port and the 240-degree port. As depicted, the input (Vin−) is coupled in parallel to the 120-degree port and the 240-degree port via resistors (e.g., 20k resistors). The first differential amplifier 202a may also include a resistor (e.g., 10k resistor) coupled in parallel between the input (Vin−) and the output (Vo) of the first differential amplifier 202a. The first differential amplifier 202a may also include an input (Vin+) coupled to the 0-degree port. As depicted, the input (Vin+) is coupled to the 0-degree port via resistors (e.g., 10k resistor). The first differential amplifier 202a also includes a resistor (e.g., 10k resistor) coupled to ground in parallel with the input (Vin+). The output (Vo) of the first differential amplifier 202a is the in-phase signal (AI).

In embodiments, the image-reject filter 106a includes a second differential amplifier 202b. The second differential amplifier 202b is coupled to the 120-degree port and the 240-degree port. The second differential amplifier 202b is configured to output a quadrature signal (AQ) based on the signals from the 120-degree port and the 240-degree port.

The quadrature signal 203 is represented by the cosine function of each of these three-phase signals 107. The second differential amplifier 202b takes the sum of the cosine of the 120-degree phase and the 240-degree phase of the three-phase signals 107 multiplied by the voltage present to get the quadrature signal 203. For example, the quadrature signal 203 is equal to the magnitude of the signal at the 120-degree phase (A120°) times the cos (120°) plus the magnitude of the signal at the 240-degree phase) (A240°) times the cos (240°), or in other words $$AQ = (A120°)*\cos(120°) + (A240°)*\cos(240°).$$

A schematic of the second differential amplifier 202b is now described. For example, the second differential amplifier 202b may include an input (Vin−) coupled to the 240-degree port. As depicted, the input (Vin−) is coupled to the 240-degree port via resistor (e.g., 11.5k resistor). The second differential amplifier 202b may also include a resistor (e.g., 10k resistor) coupled in parallel between the input (Vin−) and the output (Vo) of the second differential amplifier 202b. The second differential amplifier 202b may also include an input (Vin+) coupled to the 120-degree port. As depicted, the input (Vin+) is coupled to the 120-degree port via resistor (e.g., 11.5k resistor). The second differential amplifier 202b also includes a resistor (e.g., 10k resistor) coupled to ground in parallel with the input (Vin+). The output (Vo) of the second differential amplifier 202b is the quadrature signal (AQ).

In embodiments, the image-reject filter 106b is configured to generate the in-phase signal 201 and the quadrature signal 203 based on three-phase signals 107 received from the 0-degree port, the 120-degree port, and the 240-degree port.

In embodiments, the image-reject filter 106a includes the two-phase Hilbert transformer 204. The 2-phase Hilbert transformer 204 is configured to receive the in-phase signal 201 and the quadrature signal 203 and further configured to output a phase-shifted quadrature signal 205 based on the quadrature signal 203. The 2-phase Hilbert transformer 204 may also be referred to as a phase delay. The 2-phase Hilbert transformer 204 is coupled to the differential amplifiers 202 and receives the in-phase signal 201 and quadrature signal 203. The 2-phase Hilbert transformer 204 performs the Hilbert transform (HT) on the in-phase signal 201 and quadrature signal 203. The Hilbert transform is a mathematical process to shift the phase of the quadrature signal 203 by 90 degrees relative to the in-phase signal 201. The two-phase Hilbert transformer 204 outputs the in-phase signal 201 and a phase-shifted quadrature signal 205 ($\widehat{AQ}$).

In embodiments, the image-reject filter 106a includes the 2-input summing circuit 206. The 2-input summing circuit 206 is configured to generate the baseband signal 103 based on the in-phase signal 201 and the phase-shifted quadrature signal 205. The 2-input summing circuit 206 is configured to receive the in-phase signal 201 and the phase-shifted quadrature signal 205 from the 2-phase Hilbert transformer 204. The 2-input summing circuit 206 is configured to sum the in-phase signal 201 and the phase-shifted quadrature signal 205 to generate the baseband signal 103. Everything that is in the upper sideband will have constructive interference when the signals add. The lower sideband has destructive interference and reduces to zero. The constructive and destructive interference reduces the ambiguity of upper versus lower sideband output in the baseband signal 103.

In some embodiments, the 2-phase Hilbert transformer 204 and/or the 2-input summing circuit 206 is performed by an analog circuit. In some embodiments, the 2-phase Hilbert transformer 204 and/or the 2-input summing circuit 206 is performed by a digital signal processor (DSP). The receiver 100 comprises the DSP comprising the 2-phase Hilbert transformer 204 and the 2-input summing circuit 206.

A discussion of the image-reject filter 106a in transmit is now described. The 2-phase Hilbert Transformer 204 and the 2-input summing circuit 206 may each operate in reverse (e.g., for up conversion). The operational amplifiers of the differential amplifier 202 may not operate in reverse (e.g., for up conversion). The schematic of the image-reject filter 106a may be modified to switch out the differential amplifiers 202. Instead, the in-phase signal 201 and the quadrature signal 203 output by the 2-phase Hilbert transformer 204 is provided to a 2-phase to 3-phase transformer or the like. The image-reject filter 106a may be modified to switch out the differential amplifiers 202 by a diplexer or the like.

In some embodiments, the image-reject filter 106a is limited by a frequency response of the operational amplifiers of the differential amplifiers 202. For example, the operational amplifiers may be useable up to 100 MHz.

Figure 3:
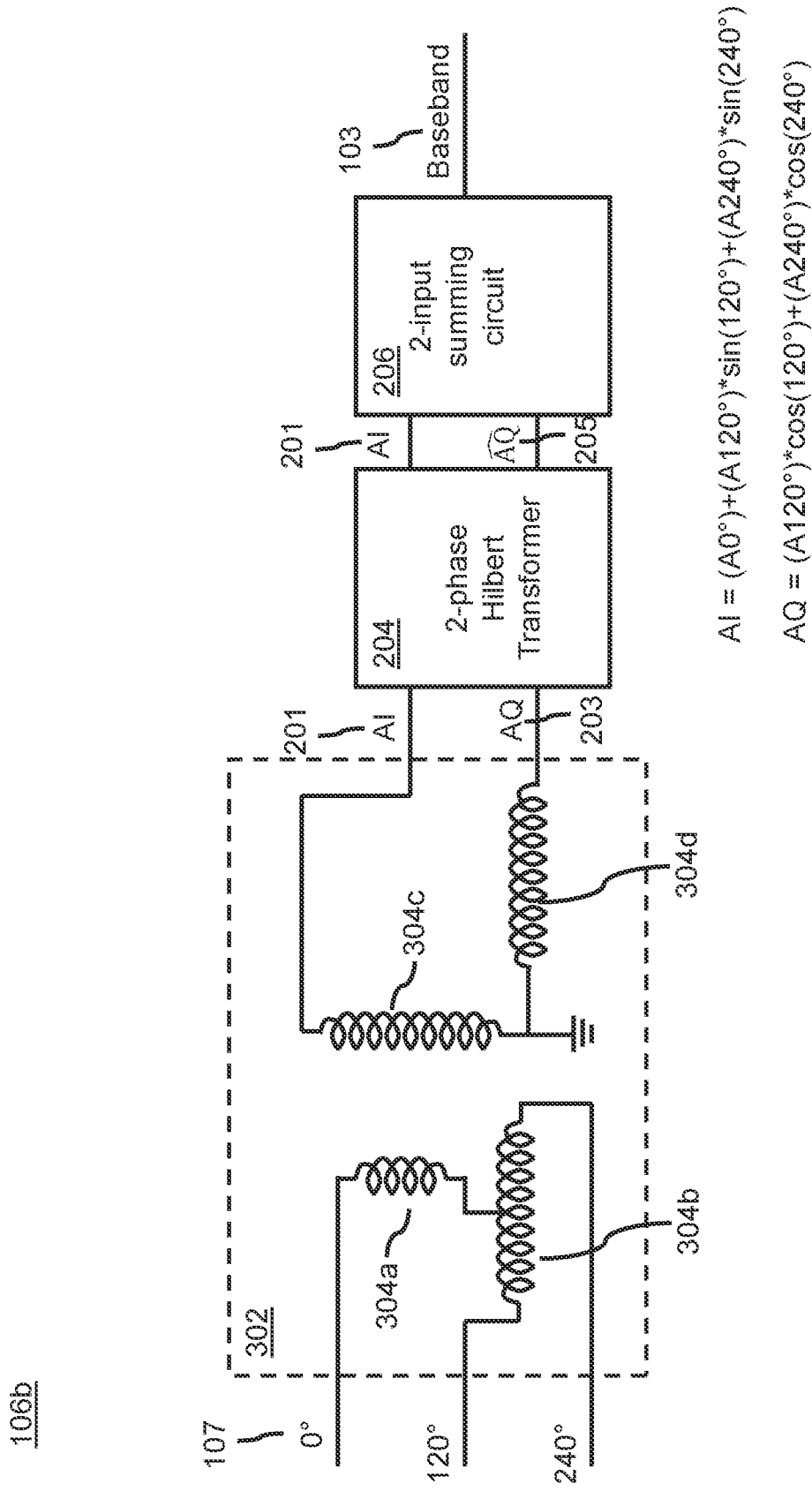
FIG. 3 depicts a schematic diagram of an image-reject filter including a 3-phase to 2-phase transformer, in accordance with one or more embodiments of the present disclosure.

Referring now to FIG. 3, image-reject filter 106b including is described, in accordance with one or more embodiments of the present disclosure. The image-reject filter 106b is one example of the image-reject filter 106 of the receiver 100. The discussion of the image-reject filter 106a is incorporated by reference in the entirety as to the image-reject filter 106b. The image-reject filter 106b is similar to the image-reject filter 106a, with the exception that the image-reject filter 106b includes a 3-phase to 2-phase transformer 302. The image-reject filter 106b also does not include the differential amplifiers 202.

The image-reject filter 106b includes one or more components, such as, but not limited to, 3-phase to 2-phase transformer 302, the 2-phase Hilbert transformer 204, and the 2-input summing circuit 206. The discussion of the 2-phase Hilbert transformer 204 and the 2-input summing circuit 206 is incorporated herein by reference in the entirety.

In embodiments, the image-reject filter 106b includes the 3-phase to 2-phase transformer 302. The 3-phase to 2-phase transformer 302 may be referred to as a phase conversion transformer, a hybrid transformer, or a Scott-T transformer. The 3-phase to 2-phase transformer 302 is coupled to the 0-degree port, the 120-degree port, and the 240-degree port. The 3-phase to 2-phase transformer 302 is configured to receive the three-phase signals 107 and output the in-phase signal (AI) 201 and the quadrature signal (AQ) 203 based on three-phase signals 107 received from the 0-degree port, the 120-degree port, and the 240-degree port. The 3-phase to 2-phase transformer 302 output the in-phase signal (AI) 201 and the quadrature signal (AQ) 203 to the 2-phase Hilbert transformer 204.

The 3-phase to 2-phase transformer 302 is a passive device. The 3-phase to 2-phase transformer 302 introduce low noise into the in-phase signal 201 and the quadrature signal 203. In some embodiments, the transformer may achieve a frequency response up to a GHz or more for the baseband bandwidth.

A schematic of the 3-phase to 2-phase transformer 302 is now described. The 3-phase to 2-phase transformer 302 may include one or more components, such as, but not limited to, one or more windings 304. A first winding 304a is coupled to the 0-degree port and configured to receive the signal with the 0-degree phase. The first winding 304a center taps a second winding 304b. The second winding 304b is coupled to the 120-degree port and configured to receive the signal with the 120-degree phase. The second winding 304a is also coupled to the 240-degree port and configured to receive the signal with the 240-degree phase. In this regard, the 3-phase to 2-phase transformer 302 includes the first winding 304a and the second winding 304b configured as a T configured to receive the three-phase signals 107 at branches of the T. A third-winding 304c outputs the in-phase signal 201. A fourth-winding 304d is coupled in parallel with the third-winding 304b and ground. The fourth-winding 304d outputs the quadrature signal 203.

A discussion of the image-reject filter 106b in transmit is now described. The 2-phase Hilbert Transformer 204, the 2-input summing circuit 206, and the 3-phase to 2-phase transformer 302 may each operate in reverse (e.g., for up conversion).

Figure 4:
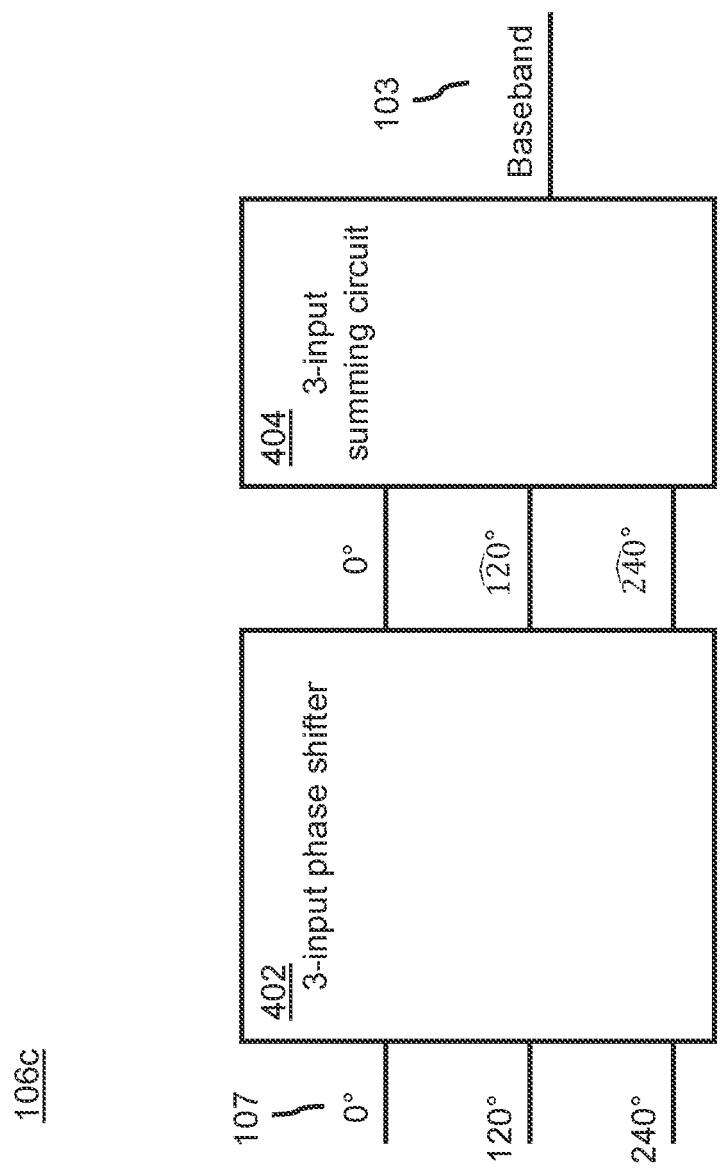
FIG. 4 depicts a schematic diagram of an image-reject filter including a 3-phase transformer, in accordance with one or more embodiments of the present disclosure.

Referring now to FIG. 4, an image-reject filter 106c is described, in accordance with one or more embodiments of the present disclosure. The image-reject filter 106c is one example of the image-reject filter 106 of the receiver 100. The image-reject filter 106c is configured to receive the three-phase signals 107 (e.g., 0-degree phase, 120-degree phase, and 240-degree phase) and output the baseband signal 103. The image-reject filter 106c includes one or more components, such as, but not limited to, a 3-input Phase shifter 402, a 3-input summing circuit 404, or the like.

In embodiments, the image-reject filter 106c includes the 3-input Phase shifter 402. The 3-input phase shifter 402 is configured to phase shift three-phase signals 107 received from the 0-degree port, the 120-degree port, and the 240-degree port to generate phase-shifted signals with a common phase. The 3-input Phase shifter 402 is configured to receive the three-phase signals 107 from the 0-degree port, the 120-degree port, and the 240-degree port. The 3-input Phase shifter 402 is configured to output phase shifted signals based on the three-phase signals 107. The 3-input Phase shifter 402 provides a broadband phase shift of the three-phase signals 107 by 120 degrees and 240 degrees respectively with respect to a reference signal. The 3-input Phase shifter 402 is directly applied to the three-phase signals 107 without an intermediate step of either an Op-amp phase converter or a 3-phase to 2-phase transformer. The 3-input phase shifter is configured to phase shift three-phase signals received from the 0-degree port, the 120-degree port, and the 240-degree port to the common phase. The common phase may include the 0-degree phase, the 120-degree phase, and/or the 240-degree phase.

In some embodiments, the 3-input phase shifter 402 is configured to phase shift the three-phase signals received from the 0-degree port, the 120-degree port, and the 240-degree port to the common phase by performing a 120-degree phase shift on signals received from the 120-degree port and performing a 240-degree phase shift on signals received from the 240-degree port. For example, the 3-input Phase shifter 402 applies a broadband 120-degree phase shift to the 120-degree phase signal and a 240-degree phase shift to the 240-degree phase signal. The 3-input Phase shifter 402 then outputs the 0-degree phase signal, the phase-shifted 120-degree phase signal ($\widehat{120°}$), and the phase-shifted 240-degree phase signal ($\widehat{240°}$). The common phase is then the 0-degree phase.

In embodiments, the image-reject filter 106c includes the 3-input summing circuit 404. The 3-input summing circuit 404 sums the phase-shifted signals from the 3-input Phase shifter 402 to generate the baseband signal 103. For example, the 3-input summing circuit 404 sums the 0-degree phase signal, the phase-shifted 120-degree phase signal ($\widehat{120°}$), and the phase-shifted 240-degree phase signal ($\widehat{240°}$). The 0-degree phase signal, the phase-shifted 120-degree phase signal ($\widehat{120°}$), and the phase-shifted 240-degree phase signal ($\widehat{240°}$) are summed to provide constructive and destructive interference.

A discussion of the image-reject filter 106c in transmit is now described. The 3-input Phase shifter 402 and the 3-input summing circuit 404 may each operate in reverse (e.g., for up conversion).

In some embodiments, the 3-input Phase shifter 402 and the 3-input summing circuit 404 is performed by an analog circuit. In some embodiments, the 3-input Phase shifter 402 and the 3-input summing circuit 404 is performed by a digital signal processor (DSP). The receiver 100 comprises the DSP comprising the 3-input Phase shifter 402 and the 3-input summing circuit 404.

Figure 5:
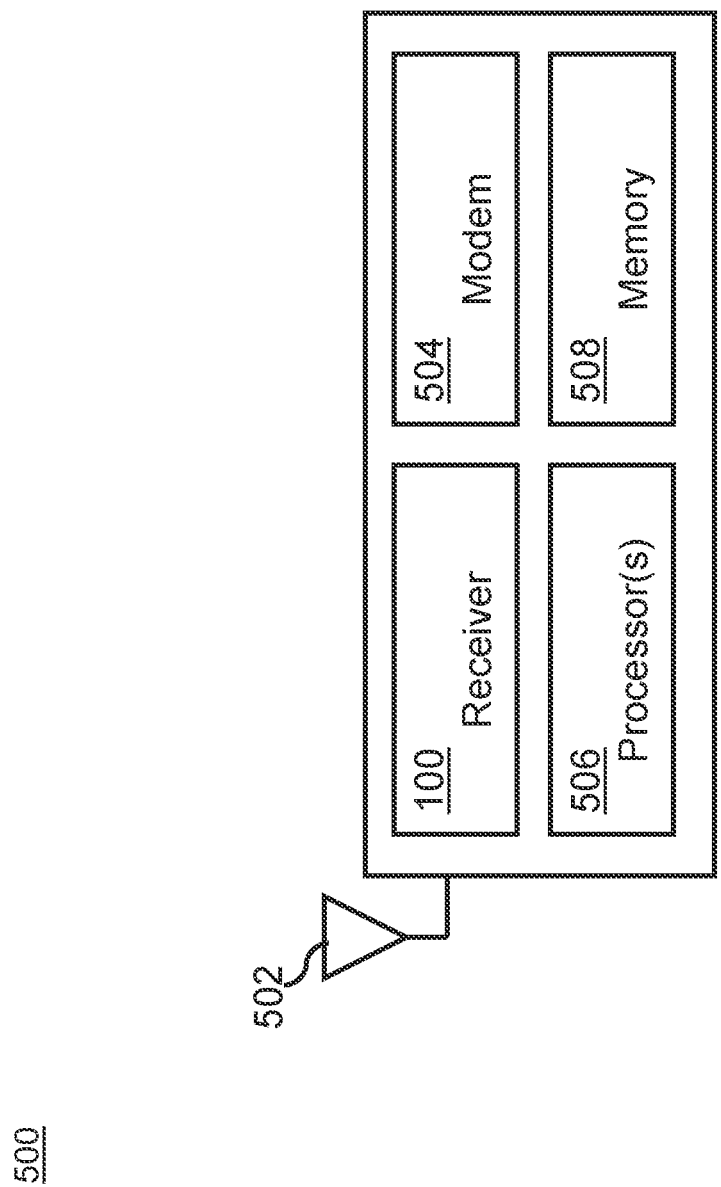
FIG. 5 depicts a simplified block diagram of a node, in accordance with one or more embodiments of the present disclosure.

Referring now to FIG. 5, a node 500, is described, in accordance with one or more embodiments of the present disclosure. The node 500 may also be referred to as a communications node 500. The node 500 includes one or more components, such as, but not limited to, an antenna 502 and the receiver 502.

In embodiments, the node 500 includes the antenna 502. The antenna 502 is configured to antenna 502 provides an interface between HF radio waves and the RF signal 101. The receiver 100 is coupled to the antenna 502. The receiver 100 is configured to receive the RF signal 101 from the antenna 502.

The node 500 may also include one or more other components, such as, but not limited to, a modem 504, processors 506, memory 508, and the like. The node 500 may additionally include bandpass filters, amplifiers, and the like. As may be understood, the node 500 may include several components, permutations, and arrangements, which are not set forth herein for clarity.

The modem 504 may provide one or more functions, such as, but not limited to, modulation and/or demodulation functions. For example, the modem 504 may modulate and/or demodulate the baseband signals 103.

The node 500 may include signal processing functionality defined in software, for generating a waveform as sampled digital signals, converting from digital-to-analog via high-speed Digital-to-Analog Converter (DAC), and then translating to the baseband signal 103. The receiver 100 may then upconvert the baseband signal 103 to the RF signal for transmission by the antenna 502. For example, the memory may maintain program instructions. The program instructions may provide the various functionality. The program instructions may be executable by the processors for performing any of the various methods described herein. The processors may also be coupled to the modem. The modem may then provide an interface for modulating and demodulating the waveform with data. In this regard, the processors and modem may host one or more layers of a waveform protocol stack.

Referring generally again to FIGS. 1-5.

An example is provided where the receiver 100 receives the RF signals 101 which include the carrier signal at the carrier frequency of 10 MHz. The SP3T switch 104 is driven by the LO signal 105 with the LO frequency of 30 MHz frequency, or three times 10 MHz. The SP3T switch 104 couples the RF port with the RF signal 101 to the each of the respective 0-degree, 120-degree, and 240-degree for $$33\frac{1}{3}$$

nanoseconds or once during each 100-nanosecond period of the 10 MHz. Undesirably, the RF signal 101 may include other signals which are received with a frequency of 30 MHz due to shortwave communications on the 10-meter band. The receiver 100 achieves immunity to the other signals with the frequency 30 MHz without the addition of a filter upstream of the SP3T switch 104.

It is contemplated that the receiver 100 provides advantages over conventional mixer-first receiver design using a single-pole, quadruple-throw (SP4T) switches (i.e., the Tayloe product detector).

The LO frequency ($f_{LO}$) of the local oscillator 102 is proportionately lower in frequency than a LO frequency for a mixer-first receiver design using a single-pole, quadruple-throw (SP4T) switch for the same carrier (C) frequency. For example, the LO frequency ($f_{LO}$) of the local oscillator 102 operates at three-quarters of the LO frequency for the mixer-first receiver design using the SP4T switch for the same carrier (C) frequency. The reduction in frequency may enable for simplifying the design of the local oscillator 102.

Additionally, the LO frequency ($f_{LO}$) of the local oscillator 102 is operated at the same LO frequency for the mixer-first receiver design using the SP4T switch to enable receiving RF signals 101 with proportionally higher carrier (C) frequencies. For example, the receiver 100 down converts RF signals 101 with carrier (C) frequencies which are four-thirds higher than the mixer-first receiver design using the SP4T switch when using the same LO frequency.

The methods, operations, and/or functionality disclosed may be implemented as sets of instructions or software readable by a device. The steps may include computations which may be performed simultaneously, in parallel, or sequentially. Further, it is understood that the specific order or hierarchy of steps in the methods, operations, and/or functionality disclosed are examples of exemplary approaches. Based upon design preferences, it is understood that the specific order or hierarchy of steps in the methods, operations, and/or functionality can be rearranged while remaining within the scope of the inventive concepts disclosed herein. The accompanying claims may present elements of the various steps in a sample order, and are not necessarily meant to be limited to the specific order or hierarchy presented. It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

A processor may include any processing unit known in the art. For example, the processor may include a multi-core processor, a single-core processor, a reconfigurable logic device (e.g., FPGAs), a digital signal processor (DSP), a special purpose logic device (e.g., ASICs)), or other integrated formats. Those skilled in the art will recognize that aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software/and or firmware would be well within the skill of one skilled in the art in light of this disclosure. Such hardware, software, and/or firmware implementation may be a design choice based on various cost, efficiency, or other metrics. In this sense, the processor(s) may include any microprocessor-type device configured to execute software algorithms and/or instructions. In general, the term "processor" may be broadly defined to encompass any device having one or more processing elements, which execute program instructions from memory, from firmware, or by hardware implemented functions. It should be recognized that the steps described throughout the present disclosure may be carried out by the processors.

A memory may include any storage medium known in the art. For example, the storage medium may include a non-transitory memory medium. For instance, the non-transitory memory medium may include, but is not limited to, a read-only memory (ROM), a random-access memory (RAM), a magnetic or optical memory device (e.g., disk), a solid-state drive and the like. It is further noted that memory may be housed in a common controller housing with the one or more processor(s). For example, the memory and the processor may be housed in a processing unit, a desktop computer, or the like. In an alternative embodiment, the memory may be located remotely with respect to the physical location of the processor. In another embodiment, the memory maintains program instructions for causing the processor(s) to carry out the various steps described through the present disclosure.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mixable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed:

1. A receiver comprising:
a local oscillator (LO) configured to generate an LO signal comprising an LO frequency;
a single-pole, triple-throw (SP3T) switch comprising:
a radio frequency (RF) port configured to receive an RF signal comprising a baseband signal modulated onto a carrier signal;
an LO port configured to receive the LO signal;
a 0-degree port, a 120-degree port, and a 240-degree port; wherein the SP3T switch is configured to sequentially switch the RF port to each of the 0-degree port, the 120-degree port, and the 240-degree port at the LO frequency; wherein the LO frequency is three times the carrier frequency such that the RF port is sequentially switched to each of the 0-degree port, the 120-degree port, and the 240-degree port once during each period of the LO frequency and such that the SP3T switch switches between the 0-degree port, the 120-degree port, and the 240-degree port for a third of each period of the RF signal;
a first capacitor coupled between the 0-degree port and ground;
a second capacitor coupled between the 120-degree port and ground;
a third capacitor coupled between the 240-degree port and ground; and
an image-reject filter coupled to the 0-degree port, the 120-degree port, and the 240-degree port; wherein the image-reject filter is configured to output the baseband signal.

2. The receiver of claim 1, wherein the receiver is a mixer-first design which does not comprise an amplifier preceding the SP3T switch.

3. The receiver of claim 2, wherein the receiver intrinsically rejects third-harmonics of the LO frequency in the RF signal; wherein the receiver does not comprise a filter preceding the SP3T switch.

4. The receiver of claim 1, wherein the first capacitor is configured to low-pass filter the 0-degree port; wherein the second capacitor is configured to low-pass filter the 120-degree port; wherein the third capacitor is configured to low-pass filter the 240-degree port.

5. The receiver of claim 1, wherein the local oscillator is a variable frequency oscillator.

6. The receiver of claim 1, wherein the receiver is a transceiver configured to upconvert the baseband signal to the RF signal.

7. The receiver of claim 1, wherein the RF signal comprises the baseband signal modulated onto the carrier signal via single-sideband modulation.

8. The receiver of claim 1, wherein the image-reject filter comprises:
a first differential amplifier coupled to the 0-degree port, the 120-degree port, and the 240-degree port; wherein the first differential amplifier is configured to output an in-phase signal based on three-phase signals received from the 0-degree port, the 120-degree port, and the 240-degree port;
a second differential amplifier coupled to the 120-degree port and the 240-degree port; wherein the second differential amplifier is configured to output a quadrature signal based on three-phase signals from the 120-degree port and the 240-degree port.

9. The receiver of claim 1, wherein the image-reject filter comprises:
a 3-phase to 2-phase transformer coupled to the 0-degree port, the 120-degree port, and the 240-degree port; wherein the 3-phase to 2-phase transformer is configured to output an in-phase signal and a quadrature signal based on three-phase signals received from the 0-degree port, the 120-degree port, and the 240-degree port.

10. The receiver of claim 1, wherein the image-reject filter is configured to generate an in-phase signal and a quadrature signal based on three-phase signals received from the 0-degree port, the 120-degree port, and the 240-degree port; wherein the image-reject filter comprises:
a 2-phase Hilbert transformer configured to receive the in-phase signal and the quadrature signal and further configured to output a phase-shifted quadrature signal based on the quadrature signal; and
a 2-input summing circuit configured to generate the baseband signal based on the in-phase signal and the phase-shifted quadrature signal.

11. The receiver of claim 10, comprising a digital signal processor comprising the 2-phase Hilbert transformer and the 2-input summing circuit.

12. The receiver of claim 1, wherein the image-reject filter comprises:
a 3-input phase shifter configured to phase shift three-phase signals received from the 0-degree port, the 120-degree port, and the 240-degree port to generate phase-shifted signals with a common phase;
a 3-input summing circuit configured to sum the phase-shifted signals from the 3-input phase shifter to generate the baseband signal.

13. The receiver of claim 12, wherein the 3-input phase shifter is configured to perform a 120-degree phase shift on signals received from the 120-degree port and perform a 240-degree phase shift on signals received from the 240-degree port.

14. The receiver of claim 12, comprising a digital signal processor comprising the 3-input phase shifter and the 3-input summing circuit.

15. The receiver of claim 1, wherein a Fourier decomposition of the LO signal contains a second harmonic term, wherein the second harmonic term appears in the three-phase signals output by the SP3T switch, wherein the second harmonic term is rejected by the image-reject filter.

16. The receiver of claim 1, wherein the carrier frequency is in at least one of the High Frequency (HF) band or the Very High Frequency (VHF) band.

17. The receiver of claim 16, wherein the carrier frequency is in the HF band, wherein the SP3T switch is a Transistor-transistor logic (TTL) chip with a frequency limitation of 90 MHz.

18. A system comprising:
an antenna configured to generate a radio frequency (RF) signal;
a receiver coupled to the antenna, the receiver comprising:
a local oscillator (LO) configured to generate an LO signal comprising an LO frequency;
a single-pole, triple-throw (SP3T) switch comprising:

a radio frequency (RF) port configured to receive the RF signal comprising a baseband signal modulated onto a carrier signal;

an LO port configured to receive the LO signal;

a 0-degree port, a 120-degree port, and a 240-degree port; wherein the SP3T switch is configured to sequentially switch the RF port to each of the 0-degree port, the 120-degree port, and the 240-degree port at the LO frequency; wherein the LO frequency is three times the carrier frequency such that the RF port is sequentially switched to each of the 0-degree port, the 120-degree port, and the 240-degree port once during each period of the LO frequency and such that the SP3T switch switches between the 0-degree port, the 120-degree port, and the 240-degree port for a third of each period of the RF signal;

a first capacitor coupled between the 0-degree port and ground;

a second capacitor coupled between the 120-degree port and ground;

a third capacitor coupled between the 240-degree port and ground; and an image-reject filter coupled to the 0-degree port, the 120-degree port, and the 240-degree port; wherein the image-reject filter is configured to output the baseband signal.

\* \* \* \* \*